(12) United States Patent
Machida

(10) Patent No.: US 9,082,672 B2
(45) Date of Patent: Jul. 14, 2015

(54) SEMICONDUCTOR DEVICE AND METHOD OF MANUFACTURING THE SAME, AND WIRING SUBSTRATE AND METHOD OF MANUFACTURING THE SAME

(71) Applicant: SHINKO ELECTRIC INDUSTRIES CO., LTD., Nagano-shi, Nagano (JP)

(72) Inventor: Yoshihiro Machida, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 13/920,336

(22) Filed: Jun. 18, 2013

(65) Prior Publication Data

US 2013/0341788 A1    Dec. 26, 2013

(30) Foreign Application Priority Data

Jun. 20, 2012    (JP) .................................. 2012-138474

(51) Int. Cl.
*H01L 29/24*    (2006.01)
*H01L 23/00*    (2006.01)
(Continued)

(52) U.S. Cl.
CPC ............ *H01L 24/13* (2013.01); *H01L 21/4846* (2013.01); *H01L 23/49811* (2013.01); *H01L 24/11* (2013.01); *H05K 1/11* (2013.01); *H05K 3/4007* (2013.01); *H01L 24/03* (2013.01); *H01L 24/05* (2013.01); *H01L 2224/0345* (2013.01); *H01L 2224/0361* (2013.01); *H01L 2224/03912* (2013.01); *H01L 2224/0401* (2013.01); *H01L 2224/05124* (2013.01); *H01L 2224/05147* (2013.01); *H01L 2224/05166* (2013.01); *H01L 2224/05171* (2013.01); *H01L 2224/05568* (2013.01); *H01L 2224/05647* (2013.01); *H01L 2224/11462* (2013.01); *H01L 2224/11472* (2013.01); *H01L 2224/13017* (2013.01); *H01L 2224/13147* (2013.01);
(Continued)

(58) Field of Classification Search
CPC .......... H01L 2924/01079; H01L 2224/13099; H01L 2924/01029; H01L 2924/01078; H01L 2924/01013
USPC ........................................................ 257/737
See application file for complete search history.

(56) References Cited

U.S. PATENT DOCUMENTS 6,214,642 B1 *  4/2001   Chen et al. ................... 438/108
7,227,262 B2 *  6/2007   Tanida et al. ................. 257/737

(Continued)

FOREIGN PATENT DOCUMENTS

JP    2004-200247    7/2004

*Primary Examiner* — Steven Loke
*Assistant Examiner* — Didarul Mazumder
(74) *Attorney, Agent, or Firm* — Rankin, Hill & Clark LLP

(57) ABSTRACT

A semiconductor device has a semiconductor substrate, an electrode pad formed on a surface of the semiconductor substrate, and a protruding electrode electrically connected to the electrode pad. The protruding electrode comprises a pedestal part formed on the electrode pad and a protruding part formed on the pedestal part. The protruding part has a columnar part with a width smaller than that of the pedestal part, and a tapered part with a width gradually increased from an end of the columnar part side toward an end of the pedestal part side. An angle of inclination of a side surface of the tapered part with respect to a plane surface perpendicular to the surface is larger than an angle of inclination of a side surface of the pedestal part and an angle of inclination of a side surface of the columnar part with respect to the plane surface.

10 Claims, 4 Drawing Sheets

(51) Int. Cl.
*H05K 1/11* (2006.01)
*H01L 21/48* (2006.01)
*H05K 3/40* (2006.01)
*H01L 23/498* (2006.01)
*H05K 3/10* (2006.01)

(52) U.S. Cl.
CPC ...... *H01L 2924/00014* (2013.01); *H05K 3/108* (2013.01); *H05K 2203/1476* (2013.01)

(56) References Cited

U.S. PATENT DOCUMENTS

| | | | |
|---|---|---|---|
| 7,407,877 B2* | 8/2008 | Kweon et al. | 438/612 |
| 8,525,350 B2* | 9/2013 | Pendse | 257/781 |
| 2002/0011655 A1* | 1/2002 | Nishiyama et al. | 257/688 |

* cited by examiner

SEMICONDUCTOR DEVICE AND METHOD OF MANUFACTURING THE SAME, AND WIRING SUBSTRATE AND METHOD OF MANUFACTURING THE SAME

CROSS-REFERENCE TO RELATED APPLICATION(S)

The present application claims the benefit of priority of Japanese Patent Application No. 2012-138474, filed on Jun. 20, 2012. The disclosures of this application are incorporated herein by reference.

BACKGROUND

1. Technical Field

The present disclosure relates to a semiconductor device and a wiring substrate, and methods of manufacturing the semiconductor device and the wiring substrate.

2. Related Art

A semiconductor device or a wiring substrate including a protruding electrode used as an external connecting terminal is known in the related art. In such a semiconductor device or a wiring substrate, various attempts to be able to narrow a pitch of the protruding electrode have been made.

In such a semiconductor device or a wiring substrate, the protruding electrode is formed, for example, in the following manner (an example of forming a protruding electrode on a semiconductor device is shown herein). First, a metal layer is formed on a semiconductor substrate (semiconductor wafer) and a resist layer including an opening is formed on the metal layer. Then, a protruding part is formed on the metal layer exposed to the inside of the opening by, for example, an electrolytic plating method. Then, after the resist layer is removed, the metal layer which is not covered with the protruding part is removed by etching. Accordingly, for example, a circularly columnar protruding electrode in which the protruding part is formed on the metal layer is formed.

PRIOR ART REFERENCE

[Patent Reference]

[Patent Reference 1] JP-A-2004-200247

However, when the metal layer which is not covered with the protruding part is removed by etching, a part of the metal layer covered with the protruding part is removed together. Concretely, a part of the metal layer covered with the vicinity of the outer periphery of the protruding part is removed, and the root of the protruding electrode is constricted annularly. In other words, a width of the lower side (the semiconductor substrate side) of the protruding electrode becomes narrower than a width of the upper side.

When the root of the protruding electrode is constricted, connection reliability decreases particularly when narrowing of a pitch or downsizing of a diameter of the protruding electrode advances. For example, thermal stress in the case of repeatedly using the semiconductor device under high temperature or low temperature causes cracks or breaks in the root (constricted portion) of the protruding electrode.

SUMMARY

Exemplary embodiments of the invention provide a semiconductor device and a wiring substrate which have a protruding electrode capable of improving connection reliability, and methods of manufacturing the semiconductor device and the wiring substrate.

A semiconductor device according to an exemplary embodiment of the invention comprises:

a semiconductor substrate;

an electrode pad formed on a surface of the semiconductor substrate; and a protruding electrode electrically connected to the electrode pad, wherein the protruding electrode comprises a pedestal part formed on the electrode pad and a protruding part formed on the pedestal part, and the protruding part comprises a tapered part formed on the pedestal part and a columnar part formed on the tapered part, the columnar part has a width smaller than that of the pedestal part, and the tapered part has a width which is gradually increased from an end of the columnar part side of the tapered part toward an end of the pedestal part side of the tapered part, and an angle of inclination of a side surface of the tapered part with respect to a plane surface perpendicular to the surface of the semiconductor substrate is larger than an angle of inclination of a side surface of the pedestal part with respect to the plane surface and an angle of inclination of a side surface of the columnar part with respect to the plane surface.

A wiring substrate according to an exemplary embodiment of the invention comprises:

an insulating member;

an electrode pad formed on a surface of the insulating member; and a protruding electrode electrically connected to the electrode pad, wherein the protruding electrode comprises a pedestal part formed on the electrode pad and a protruding part formed on the pedestal part, the protruding part comprises a tapered part formed on the pedestal part and a columnar part formed on the tapered part, the columnar part has a width smaller than that of the pedestal part, and the tapered part has a width which is gradually increased from an end of the columnar part side of the tapered part toward an end of the pedestal part side of the tapered part, and an angle of inclination of a side surface of the tapered part with respect to a plane surface perpendicular to the surface of the semiconductor substrate is larger than an angle of inclination of a side surface of the pedestal part with respect to the plane surface and an angle of inclination of a side surface of the columnar part with respect to the plane surface.

A method of manufacturing a semiconductor device, according to an exemplary embodiment, comprises:

forming an electrode pad on a surface of a semiconductor substrate; and forming a protruding electrode electrically connected to the electrode pad, the forming the protruding electrode having, forming a metal layer on the surface of the semiconductor substrate so as to cover the electrode pad, forming a resist layer comprising an opening in a portion corresponding to a formation position of the protruding electrode on the metal layer, forming an annular notch in an end of the metal layer side of the resist layer exposed to an inside of the opening, filling the inside of the opening including the notch with a metal and forming a protruding part including a tapered part formed in the notch and a columnar part formed integrally to the tapered part on the tapered part, removing the resist layer, and forming a pedestal part between the electrode pad and the tapered part by removing a part of the metal layer using the protruding part as a mask to form the protruding electrode comprising the pedestal part and the protruding part.

A method of manufacturing a wiring substrate according to an exemplary embodiment, comprises:

forming an electrode pad on a surface of an insulating member; and forming a protruding electrode electrically connected to the electrode pad, the forming the protruding electrode having, forming a metal layer on the surface of the insulating member so as to cover the electrode pad, forming a resist layer comprising an opening in a portion corresponding to a formation position of the protruding electrode on the metal layer, forming an annular notch in an end of the metal layer side of the resist layer exposed to an inside of the opening, filling the inside of the opening including the notch with a metal and forming a protruding part including a tapered part formed in the notch and a columnar part formed integrally to the tapered part on the tapered part, removing the resist layer, and forming a pedestal part between the electrode pad and the tapered part removing a part of the metal layer using the protruding part as a mask to form the protruding electrode comprising the pedestal part and the protruding part.

According to the exemplary embodiments of the invention, it is possible to provide a semiconductor device and a wiring substrate which have a protruding electrode capable of improving connection reliability, and methods of manufacturing the semiconductor device and the wiring substrate.

DETAILED DESCRIPTION

Exemplary embodiments of the invention will hereinafter be described with reference to the drawings. The overlap description may be omitted by assigning the same numerals to the same components in each of the drawings.

<First Embodiment>

[Structure of Semiconductor Device According to First Embodiment]

Figure 1:
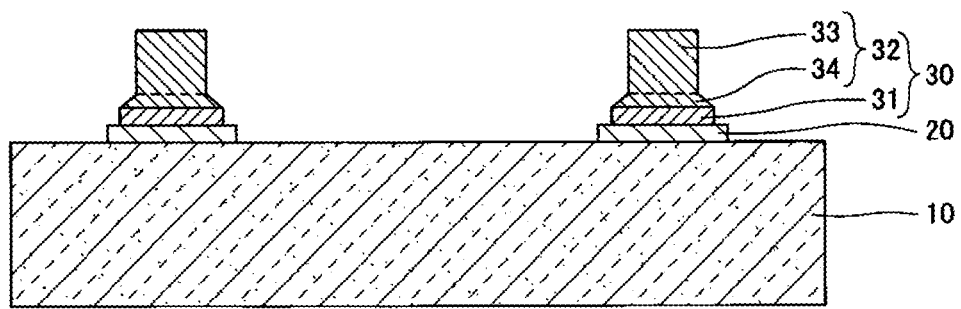
FIG. 1 is a sectional view showing a semiconductor device according to a first embodiment.

FIG. 1 is a sectional view showing a semiconductor device according to a first embodiment. Referring to FIG. 1, a semiconductor device 1 has a semiconductor substrate 10, an electrode pad 20, and a protruding electrode 30.

The semiconductor substrate 10 is a substrate obtained by cutting and separating a semiconductor substrate (wafer) with substantially a circular shape formed in a thin plate. As a material of the semiconductor substrate 10, for example, silicon (Si), germanium (Ge), or gallium arsenide (GaAs) can be used and, the following description will be made by taking the silicon (Si) as an example. A thickness of the semiconductor substrate 10 can be set in, for example, about 50 to 800 μm.

A semiconductor integrated circuit (not shown) is formed in the side of the electrode pad 20 of the semiconductor substrate 10. The semiconductor integrated circuit (not shown) includes a diffusion layer (not shown), an insulating layer (not shown), a via (not shown), wiring (not shown), etc. formed in the semiconductor substrate 10. A surface of the side in which the electrode pad 20 is formed of the semiconductor substrate 10 may be called a principal surface.

The electrode pad 20 is formed on the principal surface of the semiconductor substrate 10. The electrode pad 20 is electrically connected to the wiring (not shown) formed on the semiconductor integrated circuit (not shown). As a material of the electrode pad 20, for example, aluminum (Al) can be used.

As the material of the electrode pad 20, for example, a material in which an aluminum (Al) layer is formed on a copper (Cu) layer, or a material in which a silicon (Si) layer is formed on a copper (Cu) layer and an aluminum (Al) layer is further formed on the silicon (Si) layer may be used. A thickness of the electrode pad 20 can be set in, for example, about 10 μm.

The principal surface of the semiconductor substrate 10 may be provided with a protective film so as to expose the electrode pad 20. As the protective film, for example, a SiN film or a PSG film can be used. Also, a layer made of polyimide etc. may be further provided to a layer made of the SiN film, the PSG film, etc.

The protruding electrode 30 has a pedestal part 31 and a protruding part 32, and is electrically connected to the electrode pad 20. The pedestal part 31 is formed on the electrode pad 20. The pedestal part 31 may be formed on the whole surface on the electrode pad 20, or may be formed in a region etc. excluding the outer periphery of the electrode pad 20. The pedestal part 31 is a conductor, and can have, for example, a stack structure of a titanium (Ti) film and a copper (Cu) film. In this case, a thickness of the titanium (Ti) film can be set in, for example, about 0.1 μm and a thickness of the copper (Cu) film can be set in, for example, about 0.5 μm. The pedestal part 31 may have, for example, a stack structure of a chromium (Cr) film and a copper (Cu) film. The pedestal part 31 can be formed in, for example, a disk shape, and a diameter in that case can be set in, for example, about 20 to 50 μm.

The protruding part 32 is formed on the pedestal part 31. The protruding part 32 includes a columnar part 33 with a width smaller than that of the pedestal part 31, and a tapered part 34 whose width is gradually increased from an end of the side of the columnar part 33 in the tapered part 34 toward an end of the side of the pedestal part 31 in the tapered part 34. In other words, a planar shape of the columnar part 33 is formed smaller than a planar shape of the pedestal part 31, and the tapered part 34 annularly projects from the outer edge of the columnar part 33 to the outside in plan view. Also, a side surface of the tapered part 34 is an inclined surface. The columnar part 33 is formed integrally to the tapered part 34, but for convenience, a boundary part (boundary set for description) is shown by a broken line.

An angle of inclination of the side surface of the tapered part 34 with respect to a plane surface perpendicular to the principal surface of the semiconductor substrate 10 is formed larger than an angle of inclination of a side surface of the pedestal part 31 with respect to the plane surface and an angle of inclination of a side surface of the columnar part 33 with respect to the plane surface. The angle of inclination of the side surface of the pedestal part 31 with respect to the plane surface and the angle of inclination of the side surface of the columnar part 33 with respect to the plane surface are substantially 0°. That is, the side surface of the pedestal part 31 and the side surface of the columnar part 33 are formed substantially perpendicularly to the principal surface of the semiconductor substrate 10.

The columnar part 33 can be formed in, for example, a circularly columnar shape. In this case, a diameter of the columnar part 33 can be set in, for example, about 20 to 50 μm. However, the diameter of the columnar part 33 becomes smaller than a diameter of the pedestal part 31 by about several μm (for example, 5 μm or less). A planar shape of the tapered part 34 can be formed in, for example, a circular shape. In this case, the minimum diameter (diameter of the portion continuous with the columnar part 33) of the tapered part 34 is equal to the diameter of the columnar part 33. The maximum diameter (diameter of the portion abutting on the pedestal part 31) of the tapered part 34 can be set in, for example, about 4 μm plus the diameter of the columnar part 33. In this case, the tapered part 34 annularly projects from the outer edge of the columnar part 33 to the outside in plan view, and a width of the portion projecting from the outer edge of the columnar part 33 to the outside becomes about 2 μm.

The columnar part 33 and the tapered part 34 are conductors, and can be made of, for example, copper (Cu). A height of the columnar part 33 is formed higher than a height of the tapered part 34. The height of the columnar part 33 can be set in, for example, about 30 μm. The height of the tapered part 34 can be set in, for example, about several μm (for example, 5 μm or less). A sectional shape of the inclined surface of the tapered part 34 may be a straight shape or a curve shape, or a mixed shape of a straight line and a curved line. Also, the columnar part 33 may be formed in, for example, an elliptical columnar shape or a rectangular columnar shape and accordingly, the planar shape of the tapered part 34 may be formed in, for example, an elliptical shape or a rectangular shape.

As mentioned above, the protruding electrode 30 can be made of copper (Cu) as a main component. Consequently, the protruding electrode 30 may be called a copper pillar. In FIG. 1, in order to simplify the drawing, the protruding electrode 30 is represented with the number of protruding electrodes 30 decreased, but actually, for example, many protruding electrodes 30 are formed in a peripheral arrangement or an area array arrangement. A pitch of the protruding electrodes 30 can be set in, for example, about 30 to 60 μm.

[Method of Manufacturing Semiconductor Device According to First Embodiment]

Next, a method of manufacturing the semiconductor device according to the first embodiment will be described. FIGS. 2A to 2C and FIGS. 3A to 3C are diagrams showing manufacturing steps of the semiconductor device according to the first embodiment.

Figure 2A:
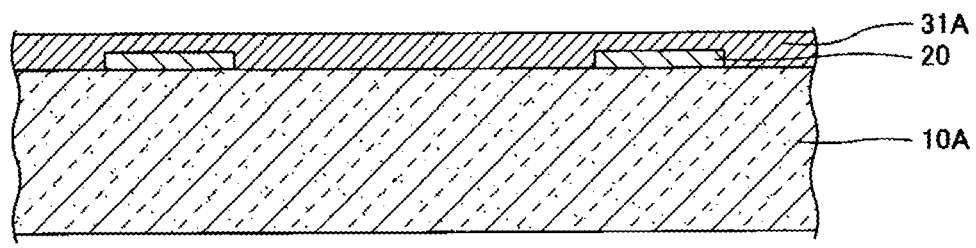
FIGS. 2A to 2C are diagrams showing manufacturing steps of the semiconductor device according to the first embodiment.

First, in a step shown in FIG. 2A, a semiconductor substrate 10A (silicon wafer) with substantially a circular shape is prepared. A diameter of the semiconductor substrate 10A can be set in, for example, 6 inches (about 150 mm), 8 inches (about 200 mm) or 12 inches (about 300 mm). Also, a thickness of the semiconductor substrate 10A can be set in, for example, 0.625 mm (for 6 inches in diameter), 0.725 mm (for 8 inches in diameter) or 0.775 mm (for 12 inches in diameter).

Next, a semiconductor integrated circuit (not shown), the electrode pad 20, etc. are respectively formed in plural regions in which the prepared semiconductor substrate 10A is finally separated and used as the semiconductor substrate 10 by a well-known technique. As a material of the electrode pad 20, for example, aluminum (Al) can be used.

As the material of the electrode pad 20, for example, a material in which an aluminum (Al) layer is formed on a copper (Cu) layer, or a material in which a silicon (Si) layer is formed on a copper (Cu) layer and an aluminum (Al) layer is further formed on the silicon (Si) layer may be used. A thickness of the electrode pad 20 can be set in, for example, about 10 μm.

Then, a metal layer 31A with which the electrode pad 20 is covered is formed on each of the principal surfaces of the plural regions used as the semiconductor substrate 10. The metal layer 31A can have, for example, a stack structure of a titanium (Ti) film and a copper (Cu) film. In this case, a thickness of the titanium (Ti) film on the electrode pad 20 can be set in, for example, about 0.1 μm and a thickness of the copper (Cu) film on the electrode pad 20 can be set in, for example, about 0.5 μm. The metal layer 31A can be formed by, for example, a sputtering method. The metal layer 31A may have, for example, a stack structure of a chromium (Cr) film and a copper (Cu) film. The metal layer 31A is the portion which is etched and used as the pedestal part 31 finally.

FIGS. 2A to 3C show only one of the plural regions (plural regions used as the semiconductor device 1) in which the semiconductor substrate 10A is finally separated and used as the semiconductor substrate 10.

Figure 2B:
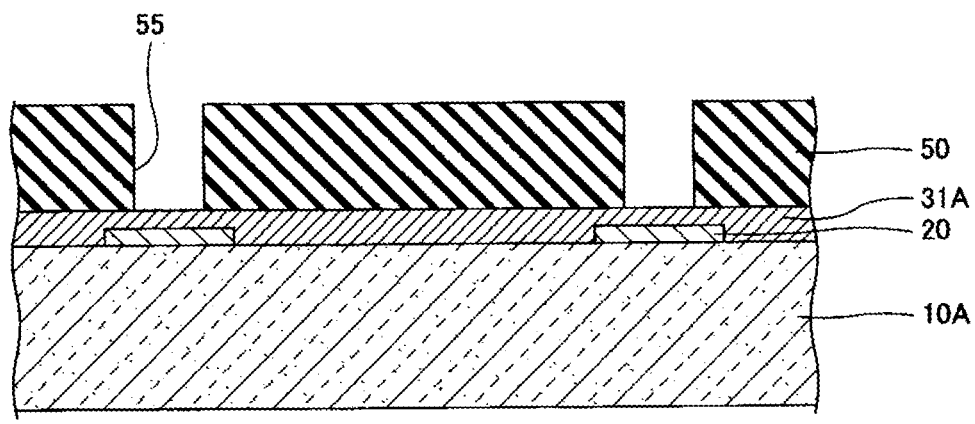

Then, in a step shown in FIG. 2B, a resist in liquid or paste form is applied or a resist in film form (a dry film resist etc.) is provided on the metal layer 31A and a resist layer 50 is formed. Then, by exposing and developing the applied or provided resist layer 50, an opening 55 is formed in the portion corresponding to a formation position of the protruding electrode 30.

The opening 55 can be formed in, for example, a peripheral arrangement or an area array arrangement. A planar shape of the opening 55 can be formed in, for example, a circular shape. When the planar shape of the opening 55 is the circular shape, a diameter of the opening 55 can be set in, for example, about 20 to 50 μm. A pitch of the openings 55 can be set in, for example, about 30 to 60 μm.

Figure 2C:
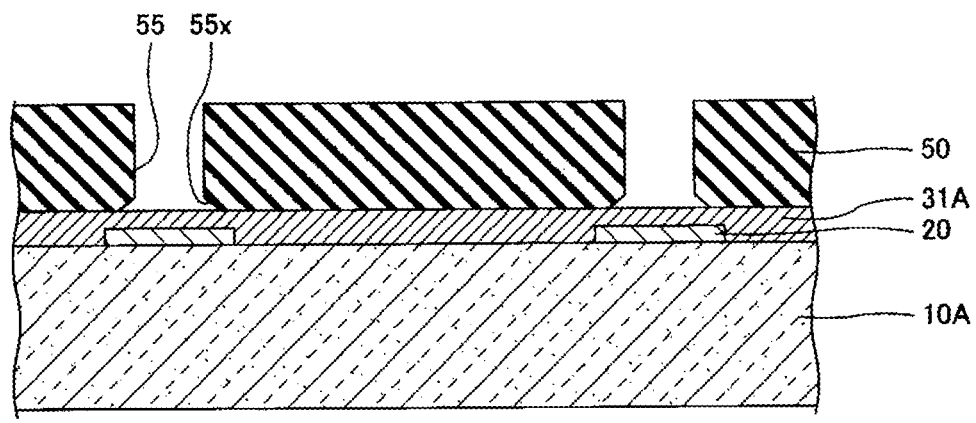

Then, in a step shown in FIG. 2C, a chemical solution is supplied to the inside of each of the openings 55, and the end (the root of the resist layer 50 exposed to the inside of each of the openings 55) of the side of the metal layer 31A in the resist layer 50 exposed to the inside of each of the openings 55 is dissolved by the chemical solution, and an annular notch 55x is formed. In the end of the side of the metal layer 31A in the resist layer 50 exposed to the inside of each of the openings 55, the notch 55x is formed in a taper shape whose width is gradually increased toward the side of the metal layer 31A.

That is, an inside surface of the notch 55x is formed in an inclined surface. The maximum diameter (diameter of the portion abutting on the metal layer 31A) of the notch 55x can be set in, for example, about 4 μm plus a diameter of the portion in which the notch 55x of the opening 55 is not formed. The highest height (height from a surface of the metal layer 31A) of the notch 55x can be set in, for example, about several μm (for example, 5 μm or less).

As the chemical solution, for example, a solution adjusted to a weak acidity can be used, but any solution may be used as long as the resist layer 50 can be dissolved. As one example of the solution adjusted to the weak acidity, for example, a sulfuric acid aqueous solution with a concentration of 5% or less can be given. This solution is particularly effective in the case of using a dry film resist as the resist layer 50. The chemical solution may be supplied by, for example, dropping from a nozzle, spraying from a spray at a predetermined pressure, or other methods.

Figure 3A:
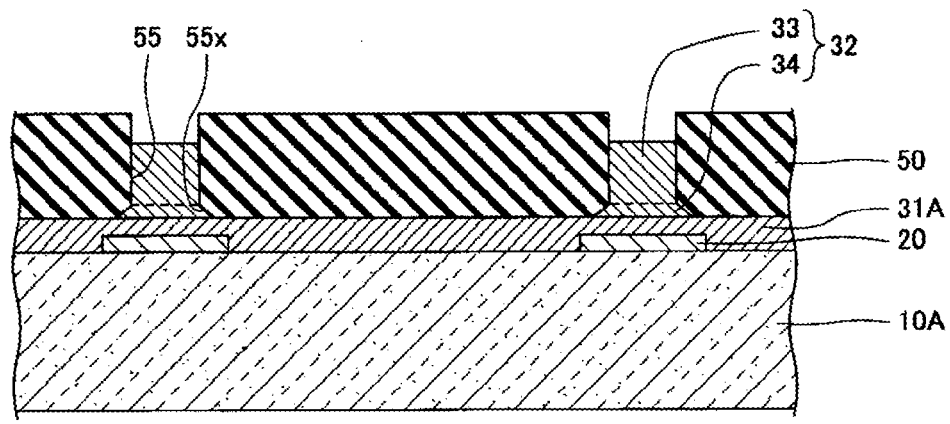
FIGS. 3A to 3C are diagrams showing manufacturing steps of the semiconductor device according to the first embodiment.

Then, in a step shown in FIG. 3A, the inside of each of the openings 55 including the notch 55x is filled with a metal, and the protruding part 32 including the columnar part 33 and the tapered part 34 is formed on the metal layer 31A exposed to the inside of each of the openings 55. The protruding part 32 can be formed by, for example, an electrolytic plating method using the metal layer 31A as a power feeding layer. As materials of the columnar part 33 and the tapered part 34, for example, copper (Cu) can be used. By this step, the protruding part 32 including the tapered part 34 formed in the notch 55x and the columnar part 33 formed integrally to the tapered part 34 on the tapered part 34 is formed. A height of the protruding part 32 can be set in, for example, about 30 μm.

Figure 3B:
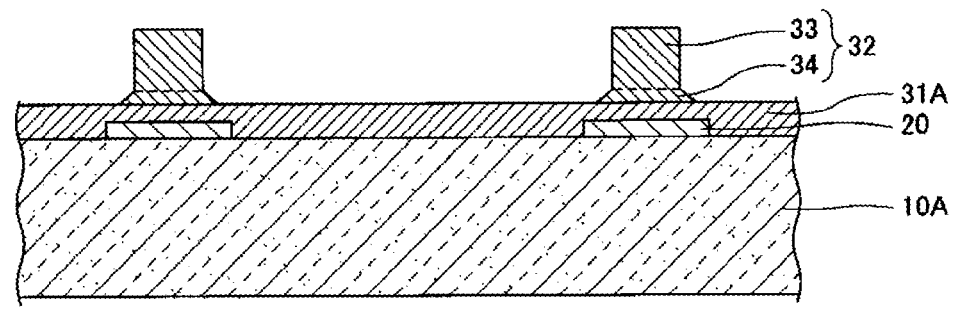

Then, in a step shown in FIG. 3B, the resist layer 50 shown in FIG. 3A is removed. Then, in a step shown in FIG. 3C, using the protruding part 32 as a mask, the unnecessary portion of the metal layer 31A shown in FIG. 3B is removed by etching, and the pedestal part 31 is formed between the electrode pad 20 and the tapered part 34. By this step, the protruding electrode 30 including the pedestal part 31 and the protruding part 32 (the columnar part 33 and the tapered part 34) is formed.

Figure 3C:
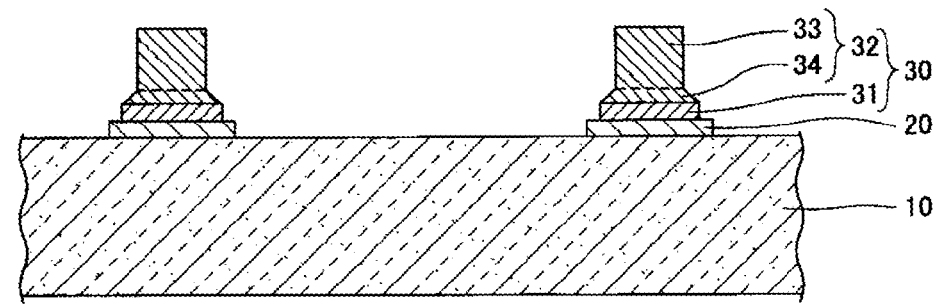

In the step shown in FIG. 3C, an angle of inclination of a side surface of the tapered part 34 with respect to a plane surface perpendicular to the principal surface of the semiconductor substrate 10 is formed larger than an angle of inclination of a side surface of the pedestal part 31 with respect to the plane surface and an angle of inclination of a side surface of the columnar part 33 with respect to the plane surface. Also, the side surface of the pedestal part 31 and the side surface of the columnar part 33 are formed substantially perpendicularly to the principal surface of the semiconductor substrate 10.

In the step shown in FIG. 3C, when the unnecessary portion of the metal layer 31A is removed by etching, the tapered part 34 of the protruding part 32 acts as an umbrella, so that the metal layer 31A is not etched excessively. As a result, the root of the protruding electrode 30 can be prevented from being constricted. More specifically, a width of the pedestal part 31 can be prevented from becoming narrower than a width of the columnar part 33 in the protruding electrode 30.

The plural semiconductor devices 1 shown in FIG. 1 are manufactured by separating the semiconductor substrate 10A by dicing etc. after the step shown in FIG. 3C.

As mentioned above, in the first embodiment, the resist layer 50 including the inside of the opening 55 is formed on the metal layer 31A, and the end of the side of the metal layer 31A in the resist layer 50 exposed to the inside of the opening 55 is dissolved to form the annular notch 55x. Then, the inside of each of the openings 55 including the notch 55x is filled with a metal, and the protruding part 32 including the columnar part 33 and the tapered part 34 is formed. Then, after the resist layer 50 is removed, using the protruding part 32 as a mask, the metal layer 31A is etched and the pedestal part 31 is formed between the electrode pad 20 and the tapered part 34, and the protruding electrode 30 including the pedestal part 31 and the protruding part 32 is formed.

Accordingly, in the step of etching the metal layer 31A, the tapered part 34 of the protruding part 32 acts as the umbrella and the metal layer 31A is not etched excessively, so that the root of the protruding electrode 30 can be prevented from being constricted. More specifically, the width of the pedestal part 31 can be prevented from becoming narrower than the width of the columnar part 33 in the protruding electrode 30.

When the root of the protruding electrode is constricted, connection reliability decreases particularly when narrowing of a pitch or downsizing of a diameter of the protruding electrode advances. For example, thermal stress in the case of repeatedly using the semiconductor device under high temperature or low temperature causes cracks or breaks in the root (constricted portion) of the protruding electrode.

In the semiconductor device 1 according to the first embodiment, the root of the protruding electrode 30 can be prevented from being constricted, so that connection reliability can be ensured even when narrowing of a pitch or downsizing of a diameter of the protruding electrode 30 advances.

<Modified Example of First Embodiment>

A modified example of the first embodiment shows an example of forming a notch 55x by a method different from that of the first embodiment. In the modified example of the first embodiment, description of the same components as those of the embodiment already described is omitted.

A dry film resist includes an acrylic copolymer and an acrylate monomer as a main component, and is slightly soluble in water. Hence, when the dry film resist is used as the resist layer 50 in the step shown in FIG. 2B, water may be supplied to the inside of each of the openings 55 in the step shown in FIG. 2C. By supplying the water to the inside of each of the openings 55, the end of the side of the metal layer 31A in the resist layer 50 exposed to the inside of each of the openings 55 is turned up by swelling and peeling and a notch 55x can be formed. A resist other than the dry film resist may be used as long as the resist is slightly soluble in water.

In order to turn up the end of the side of the metal layer 31A in the resist layer 50 exposed to the inside of each of the openings 55 by swelling and peeling, it is necessary to immerse the end of the side of the metal layer 31A in the resist layer 50 exposed to the inside of each of the openings 55 in water, for example, for about several hours. However, time of formation of the notch 55x can be shortened by hitting the end of the side of the metal layer 31A in the resist layer 50 exposed to the inside of each of the openings 55 at a predetermined water pressure.

Thus, the notch 55x may be formed by using the resist slightly soluble in water as the resist layer 50 and immersing the end of the side of the metal layer 31A in the resist layer 50 exposed to the inside of each of the openings 55 in water and turning up the lower end side of each of the openings 55 by swelling and peeling. Also in this case, there is an effect similar to that of the first embodiment.

<Second Embodiment>

A second embodiment shows an example of applying the invention to a wiring substrate. In the second embodiment, description of the same components as those of the embodiment already described is omitted.

Figure 4:
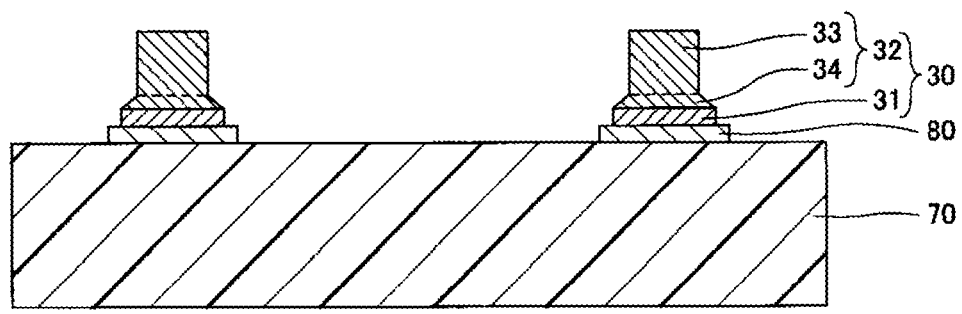
FIG. 4 is a sectional view showing a wiring substrate according to a second embodiment.

FIG. 4 is a sectional view showing a wiring substrate according to the second embodiment. Referring to FIG. 4, a wiring substrate 2 has an insulating member 70, an electrode pad 80, and a protruding electrode 30.

The insulating member 70 is, for example, a member in which a glass cloth is impregnated with an epoxy resin. A thickness of the insulating member 70 can be set in, for example, about several 100 μm. The electrode pad 80 is formed on a principal surface of the insulating member 70. The electrode pad 80 is electrically connected to a wiring pattern (not shown) formed on the principal surface of the insulating member 70. As a material of the electrode pad 80, for example, copper (Cu) can be used. A thickness of the electrode pad 80 can be set in, for example, about 10 μm.

A solder resist layer for exposing the electrode pad 80 may be formed on the principal surface of the insulating member

70. As the solder resist layer, for example, a photosensitive epoxy insulating resin can be used. Also, a surface opposite to the principal surface of the insulating member 70 may be provided with a wiring pattern to be electrically connected to the wiring pattern formed on the principal surface through a through hole pierced in the insulating member 70. Also, a multilayer wiring pattern may be formed on one or both of the principal surface of the insulating member 70 and the surface opposite to the principal surface.

The protruding electrode 30 similar to that of the first embodiment is formed on the electrode pad 80. In the wiring substrate 2, the protruding electrode 30 can be formed by a method similar to that of the first embodiment. However, as a material of a metal layer 31A formed in a step shown in FIG. 2A, for example, copper (Cu) can be used. Also, the metal layer 31A can be formed by, for example, an electroless plating method.

Also in the case of forming the protruding electrode 30 on the wiring substrate 2 thus, there is an effect similar to that of the first embodiment.

The preferred embodiments and the modified example have been described above in detail, but the invention is not limited to the embodiments and the modified example described above, and various modifications and substitutions can be made in the embodiments and the modified example described above without departing from the scope described in the claims.

For example, a modification similar to the modified example of the first embodiment may be made in the second embodiment.

Various aspects of the subject-matter described herein are set out non-exhaustively in the following numbered clauses:

1. A method of manufacturing a semiconductor device, comprising:
   forming an electrode pad on a surface of a semiconductor substrate; and
   forming a protruding electrode electrically connected to the electrode pad, the forming the protruding electrode having,
   forming a metal layer on the surface of the semiconductor substrate
   so as to cover the electrode pad,
   forming a resist layer comprising an opening in a portion corresponding to a formation position of the protruding electrode on the metal layer,
   forming an annular notch in an end of the metal layer side of the resist layer exposed to an inside of the opening,
   filling the inside of the opening including the notch with a metal and forming a protruding part including a tapered part formed in the notch and a columnar part formed integrally to the tapered part on the tapered part,
   removing the resist layer, and
   forming a pedestal part between the electrode pad and the tapered part by removing a part of the metal layer using the protruding part as a mask to form the protruding electrode comprising the pedestal part and the protruding part.

2. The method of manufacturing a semiconductor device according to clause 1, wherein the notch is formed by supplying a chemical solution to the inside of the opening to dissolve the end of the metal layer side of the resist layer exposed to the inside of the opening by the chemical solution.

3. The method of manufacturing a semiconductor device according to clause 1, wherein the notch is formed by supplying water to the inside of the opening to swell and peel the end of the metal layer side of the resist layer exposed to the inside of the opening by the water.

4. A method of manufacturing a wiring substrate, comprising:
   forming an electrode pad on a surface of an insulating member; and
   forming a protruding electrode electrically connected to the electrode pad, the forming the protruding electrode having,
   forming a metal layer on the surface of the insulating member so as
   to cover the electrode pad,
   forming a resist layer comprising an opening in a portion corresponding to a formation position of the protruding electrode on the metal layer,
   forming an annular notch in an end of the metal layer side of the resist layer exposed to an inside of the opening,
   filling the inside of the opening including the notch with a metal and forming a protruding part including a tapered part formed in the notch and a columnar part formed integrally to the tapered part on the tapered part,
   removing the resist layer, and
   forming a pedestal part between the electrode pad and the tapered part removing a part of the metal layer using the protruding part as a mask to form the protruding electrode comprising the pedestal part and the protruding part.

5. The method of manufacturing a wiring substrate according to clause 4, wherein the notch is formed by supplying a chemical solution to the inside of the opening to dissolve the end of the metal layer side of the resist layer exposed to the inside of the opening by the chemical solution.

6. The method of manufacturing a wiring substrate according to clause 4, wherein the notch is formed by supplying water to the inside of the opening to swell and peel the end of the metal layer side of the resist layer exposed to the inside of the opening by the water.

What is claimed is:

1. A semiconductor device comprising:
   a semiconductor substrate;
   an electrode pad formed on a surface of the semiconductor substrate; and
   a protruding electrode electrically connected to the electrode pad, wherein
   the protruding electrode comprises a pedestal part formed on the electrode pad and a protruding part formed on the pedestal part, wherein an entirety of the pedestal part is made of a stack of materials different than that of an entirety of the electrode pad, and
   the protruding part comprises a tapered part formed on the pedestal part and a columnar part formed on the tapered part, wherein the tapered part and the columnar part are formed of a same material,
   the columnar part has a width smaller than that of the pedestal part, and the tapered part has a width which is gradually increased from an end of the columnar part side of the tapered part toward an end of the pedestal part side of the tapered part, and
   an angle of inclination of a side surface of the tapered part with respect to a plane surface perpendicular to the surface of the semiconductor substrate is larger than an angle of inclination of a side surface of the pedestal part with respect to the plane surface and an angle of inclination of a side surface of the columnar part with respect to the plane surface.

2. The semiconductor device as claimed in claim 1, wherein a height of the columnar part is higher than a height of the tapered part.

3. A wiring substrate comprising:

an insulating member;

an electrode pad formed on a surface of the insulating member; and a protruding electrode electrically connected to the electrode pad, wherein the protruding electrode comprises a pedestal part formed on the electrode pad and a protruding part formed on the pedestal part, wherein an entirety of the pedestal part is made of a stack of materials different than that of an entirety of the electrode pad, the protruding part comprises a tapered part formed on the pedestal part and a columnar part formed on the tapered part, wherein the tapered part and the columnar part are formed of a same material, the columnar part has a width smaller than that of the pedestal part, and the tapered part has a width which is gradually increased from an end of the columnar part side of the tapered part toward an end of the pedestal part side of the tapered part, and an angle of inclination of a side surface of the tapered part with respect to a plane surface perpendicular to the surface of the insulating member is larger than an angle of inclination of a side surface of the pedestal part with respect to the plane surface and an angle of inclination of a side surface of the columnar part with respect to the plane surface.

4. The wiring substrate as claimed in claim 3, wherein a height of the columnar part is higher than a height of the tapered part.

5. The semiconductor device as claimed in claim 1, wherein the tapered part and the columnar part are formed integrally with each other.

6. The semiconductor device as claimed in claim 1, wherein the pedestal part and the tapered part are formed separately from each other.

7. The semiconductor device as claimed in claim 1, wherein the width of the tapered part continuously increases from the end of the columnar part side of the tapered part toward the end of the pedestal part side of the tapered part.

8. The wiring substrate as claimed in claim 3, wherein the tapered part and the columnar part are formed integrally with each other.

9. The wiring substrate as claimed in claim 3, wherein the pedestal part and the tapered part are formed separately from each other.

10. The wiring substrate as claimed in claim 3, wherein the width of the tapered part continuously increases from the end of the columnar part side of the tapered part toward the end of the pedestal part side of the tapered part.

* * * * *